US012784817B2

(12) United States Patent
Pelella

(10) Patent No.: US 12,784,817 B2
(45) Date of Patent: Nov. 3, 2026

(54) NOR DECODER FOR LARGE DECODE STRUCTURES

(71) Applicant: INTERNATIONAL BUSINESS MACHINES CORPORATION, Armonk, NY (US)

(72) Inventor: Antonio Pelella, Highland Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 173 days.

(21) Appl. No.: 18/749,799

(22) Filed: Jun. 21, 2024

(65) Prior Publication Data

US 2025/0391468 A1 Dec. 25, 2025

(51) Int. Cl.
*G11C 11/418* (2006.01)
*H03K 17/687* (2006.01)
*H03K 19/20* (2006.01)
*H03M 7/30* (2006.01)

(52) U.S. Cl.
CPC ........ *G11C 11/418* (2013.01); *H03K 17/6872* (2013.01); *H03K 19/20* (2013.01); *H03M 7/6005* (2013.01)

(58) Field of Classification Search
CPC .. G11C 11/418; H03K 17/6872; H03K 19/20; H03M 7/6005
USPC .................................................... 365/230.06
See application file for complete search history.

(56) References Cited

U.S. PATENT DOCUMENTS 6,794,906 B2 9/2004 Goel et al.
6,924,670 B2 8/2005 Azam
7,176,725 B2 2/2007 Dawson et al.
7,353,363 B2 4/2008 Chaudhry et al.
8,958,264 B2 2/2015 Koike et al.
9,036,447 B2 5/2015 Masleid et al.
9,214,208 B2 12/2015 Terzioglu et al.
9,627,407 B2 4/2017 Masuoka et al.
9,645,790 B2 5/2017 Beckman et al.
9,742,408 B1 * 8/2017 Bunce ...................... G11C 8/18
10,374,604 B1 * 8/2019 Pelella ............... H03K 19/0016
10,454,477 B1 10/2019 Pelella
(Continued)

OTHER PUBLICATIONS

Balobas et al., Design of Low Power, High Performance 2-4 and 4-16 Mixed-Logic Line Decoders, IEEE Transactions on Circuits and Systems II: Express Briefs (vol. 64, Issue: 2, Feb. 2017), DOI: 10.1109/TCSII.2016.2555020, Date of Publication: Apr. 15, 2016, 5 pages.

Brzozowski et al., Designing Method of Compact n-to-2n Decoders, International Journal of Electronics and Telecommunications 59(4):405-413, DOI:10.2478/eletel-2013-0050, Dec. 2013, 9 pages.
(Continued)

*Primary Examiner* — Ly D Pham
(74) *Attorney, Agent, or Firm* — Onyx IP Group

(57) ABSTRACT

A NOR decoder for large decode structures includes a first NOR decode circuit connected by a first node to an evaluation circuit. The first NOR decode circuit is configured to receive a first set of three or more inputs. The evaluation circuit is connected to a second node. The NOR decoder also includes a second NOR decode circuit connected by a third node to the evaluation circuit. The second NOR decode circuit is configured to receive a second set of three or more inputs. The evaluation circuit is configured to change a state of the second node in response to an active clock signal and all inputs in the first set and the second set having the same logical value.

20 Claims, 7 Drawing Sheets

(56) References Cited

U.S. PATENT DOCUMENTS

| | | | | |
|---|---|---|---|---|
| 11,152,942 | B2 | 10/2021 | Nagarajan et al. | |
| 11,250,895 | B1 * | 2/2022 | Sheth | G11C 8/08 |
| 11,404,096 | B2 | 8/2022 | Chen et al. | |
| 2005/0024956 | A1 * | 2/2005 | Tran | G11C 29/50004 365/200 |
| 2006/0176194 | A1 * | 8/2006 | Dawson | H03K 19/20 341/50 |
| 2006/0176757 | A1 | 8/2006 | Chan et al. | |
| 2008/0084777 | A1 | 4/2008 | Montoye et al. | |
| 2012/0163115 | A1 * | 6/2012 | Ghosh | G11C 11/4085 365/230.06 |
| 2023/0104143 | A1 | 4/2023 | Jamali et al. | |
| 2023/0170011 | A1 | 6/2023 | Shang et al. | |
| 2023/0395145 | A1 * | 12/2023 | Vankayala | G11C 13/0023 |

OTHER PUBLICATIONS

Gangwani et al., Design and analysis of a 5:32 Address decoder for a high speed SRAM based, JETIR, www.jetir.org (ISSN-2439-5162), Journal of Emerging Technologies and Innovative Research (JETIR), JETIR1808858, vol. 5, Issue 8, dated Aug. 2018, 6 pages.

Mishra et al., Novel Design Technique of Address Decoder for SRAM, 2014 IEEE International Conference on Advanced Communications, Control and Computing Technologies, DOI: 10.1109/ICACCCT.2014.7019253, Date Added to IEEE Xplore: Jan. 26, 2015, 4 pages.

Veeratiraju et al., Reconfigurable Decoder for Variable Size Low Power Memory Apllications, International Journal of Electronics and Communication Engineering Research and Development (IJECERD), vol. 3, No. 1, Jan.-Mar. 2013, 14 pages.

* cited by examiner

NOR DECODER FOR LARGE DECODE STRUCTURES

BACKGROUND

The present disclosure relates to methods, apparatus, and products for a NOR decoder for large decode structures. A random access memory device can be limited by the performance of its address decoders. A faster address decoder results in better performance of the memory array. Physical limitations restrict the number of inputs to a single decode unit, thus often requiring multiple stages of decoding for structures with large numbers of inputs.

SUMMARY

According to embodiments of the present disclosure, various methods, apparatus and products for a NOR decoder for large decode structures are described herein. In some aspects, a NOR decoder for large decode structures includes a first NOR decode circuit connected by a first node to an evaluation circuit. The first NOR decode circuit is configured to receive a first set of three or more inputs. The NOR decoder also includes a second NOR decode circuit connected by a third node to the evaluation circuit. The second NOR decode circuit is configured to receive a second set of three or more inputs. Thus, a portion of the inputs, for example a portion of an address, are provided to the first NOR decode circuit and a second portion of the inputs are provided to the second NOR decode circuit. The evaluation circuit is connected to a second node. The evaluation circuit is configured to pull the second node to low in response to an active clock signal and all inputs in the first set and the second set being low.

DETAILED DESCRIPTION

SRAM (static Random Access Memory) can be limited by the performance of its address decoders. In certain SRAM designs, as soon as a particular row of cells may be selected by the corresponding word line going high, the bit lines begin to develop a voltage based on the contents of the memory cells. The sooner the word line goes high, the better the read performance of the SRAM. Thus, an increase in the operation of the address decoders results in a better performance of the memory array.

Decoders can be implemented in CMOS logic, including combinations of p-type field-effect transistors (PFETs) and n-type field-effect transistors (NFETs), where circuits may be pre-charged in a pre-charge phase of clocking and evaluated in an evaluate phase of the clocking. These circuits may be synchronous logic circuits that generate an output depending on the combination of inputs. Decoders can be characterized has having a pre-charge phase and an evaluate phase. In the pre-charge phase, circuit nodes may be pre-charged to a predetermined level, such as high or VDD. In the evaluate phase, a transistor structure is allowed to either discharge the node to a second known level, such as low or VSS, or to allow the charge to persist. Each input signal is provided to a gate of at least one transistor in the transistor structure. The final charge on the output node is thus controlled by the values of the inputs and the way transistors in the transistor structure are turned off or on based on those values. The final voltage at the output node, high or low, acts as the output of the decoder, perhaps after being buffered.

Figure 1:
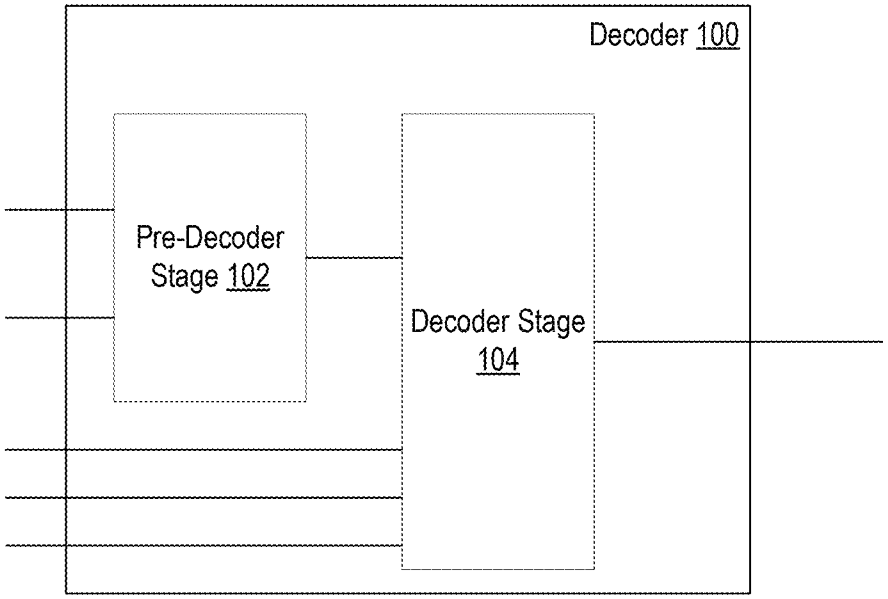
FIG. 1 sets forth example decode structure using a pre-decode stage and a decode stage.

NOR decoders are used when small setup times and fast clocked delays are important. Most high-performance conventional techniques for NOR decoding use a dynamic approach to achieve the smallest total delay. It is common in NOR decoders to place a series PFET stack that receives the inputs. However, because of design rules and restrictions on series PFETs, more than four PFETs should not be stacked. This limits the number of inputs to the NOR decoder. To achieve decode structures with greater than four inputs, two stage decode structures are usually employed to balance setup time and clocked delay. Typically, a pre-decode stage is used with a another decode stage. For further explanation, FIG. 1 sets forth a block diagram of an example 5-to-32 line NOR decoder 100 implemented with conventional techniques. Decoder 100 includes a 2-to-4 pre-decoder stage 102 to reduce the number of stages by pre-decoding two of the inputs. The output of the pre-decoder stage 102 is supplied to a 3-to-5 decoder stage along with three other inputs. The 3-to-5 decoder stage 104 includes multiple 3-to-5 decoder units whose outputs are evaluated to output the result. The use of multiple decode stages (pre-decode and decode) increases the setup times and decreases clock performance for the NOR decoder.

Figure 2:
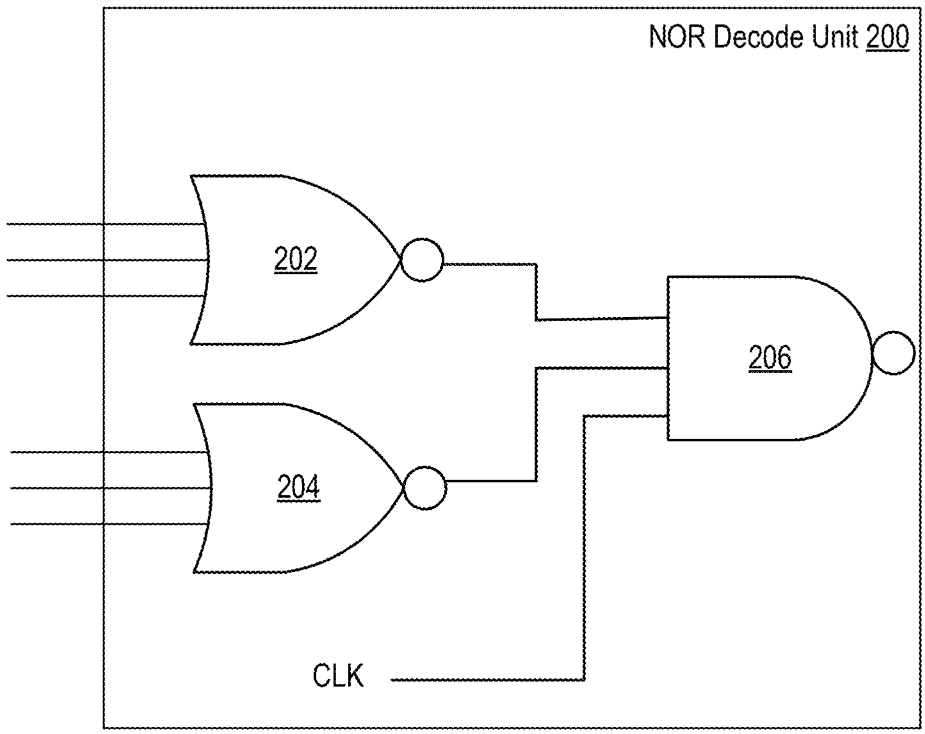
FIG. 2 sets forth a logic diagram of an example NOR decoder for large decode structures in accordance with at least one embodiment of the present disclosure.

Embodiments in accordance with the present disclosure are directed to a NOR decoder for large decode structures that decodes more than four inputs in a single stage. For further explanation, FIG. 2 sets forth a logic diagram of an example NOR decode unit for large decode structures in accordance with at least one embodiment of the present disclosure. The NOR decoder 200 includes a NOR decode phase corresponding to NOR gates 202, 204. The NOR decoder receives five or more inputs and evaluates those inputs in a single stage. The NOR gate includes two or more NOR decode circuits that each receive a portion of the inputs, and that are set up concurrently in an inactive half of a clock cycle. The NOR decoder includes an evaluation phase corresponding to NAND gate 206. The NAND gate evaluates the output of the NOR decode gates during an active half of the clock cycle. The integration of different decode circuits into a single stage is realized, in part, by isolating the NOR decode circuits onto different nodes and combining the nodes in the evaluation stage using an additional NFET and PFET in the evaluation circuit. Thus, the NOR decoder 200 evaluates all of the inputs in a single stage, like a 4-to-16 decoder, but overcomes the limitation of a four-input maximum stemming from the restrictions on PFET stacking.

In the following examples, a VDD voltage level may be referred to as "high" or "positive" or "active" and a VSS voltage level may be referred to as "low" or "negative" or "inactive." A logical "1" may be referred to as "high" or "positive" and a logical "0" may be referred to as "low" or "negative". PFET transistors conduct when the PFET transistor gate is low and NFET transistors conduct when the NFET transistor gate is high. A clock signal is "inactive" when the clock signal is "low" or a logical "0" and the clock signal is "active" when the clock signal is "high" or a logical "1."

Figure 3:
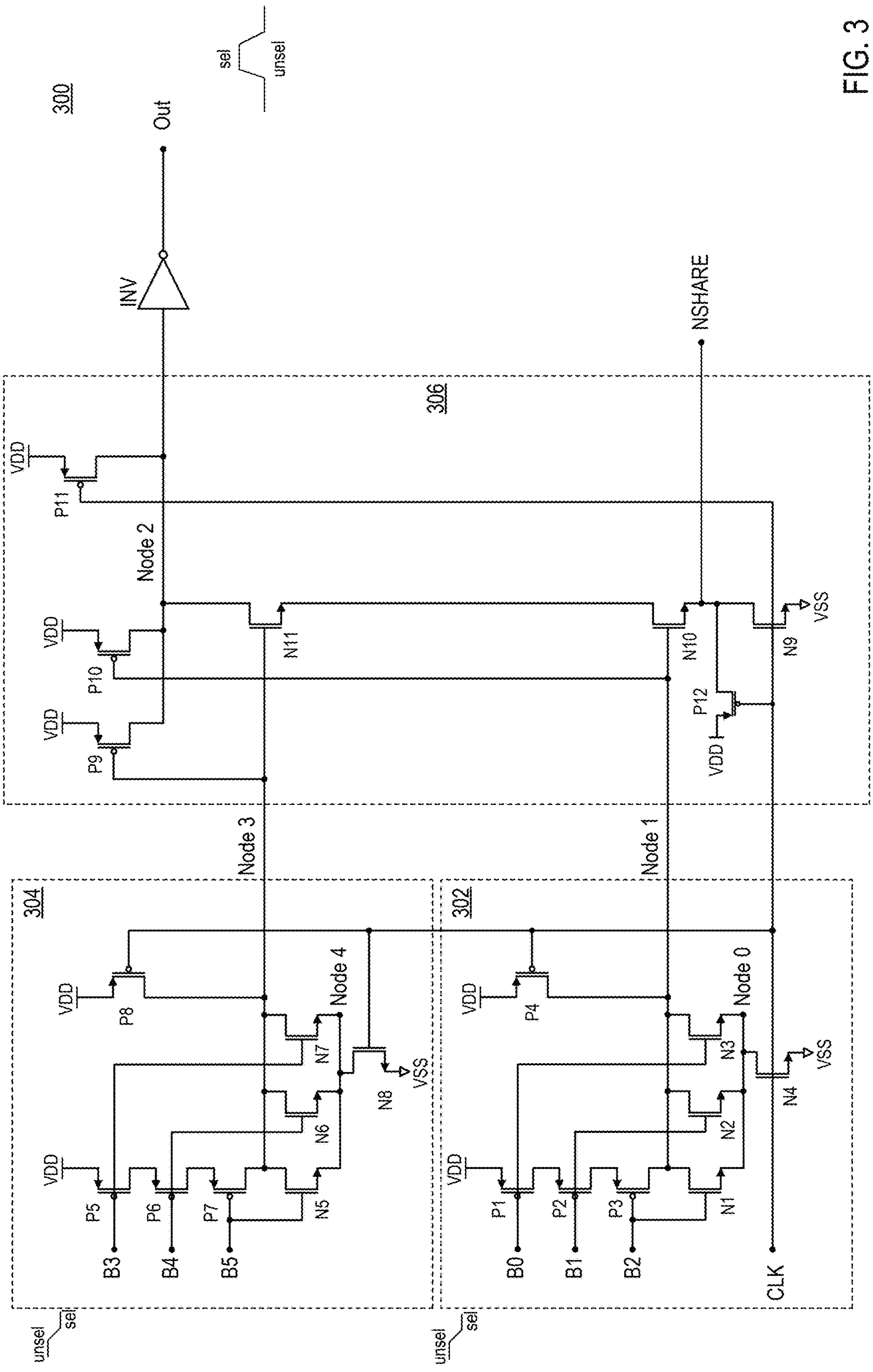
FIG. 3 sets forth a circuit diagram of an example NOR decoder for large decode structures in accordance with at least one embodiment of the present disclosure.

For further explanation, FIG. 3 sets forth a circuit diagram of an example NOR decode unit 300 of an example NOR decoder for large decode structures in accordance with at least one embodiment of the present disclosure. The example NOR decode unit 300 of FIG. 3 is operable to provide single stage NOR decode for a 6-to-64 decode scheme. To avoid stacking more than four series PFETs at the input of the decode circuit, embodiments in accordance with the present disclosure include multiple decode circuits coupled to respective nodes that are evaluated together with a single clock activation by respective NFETs of an NFET stack in the evaluation phase of the decoder. In the example of FIG. 3, the NOR decode unit 300 includes a first NOR decode circuit 302 that receives inputs B0, B1, B2 and that provides an output at Node 1, and a second NOR decode circuit 304 that receives inputs B3, B4, B5 and that provides an output at Node 3. Node 1 and Node 3 are connected to respective NFETs of the NFET stack that are evaluated in the evaluation phase. The evaluation result is applied to Node 2, which is inverted to supply the output of the NOR decode unit.

NOR decode unit 300 is characterized as a circuit that produces an active output value OUT based on input signals B0, B1, B2, B3, B4, B5 having a predetermined value. Node 1, Node 2, and Node 3 and the output node OUT are set to an initial value during the pre-charge phase of the clock CLK. In the example of FIG. 3, Node 1, Node 2, and Node 3 are pre-charged to high, resulting in the output OUT being low during the pre-charge phase (CLK low). Only when the input signals have the predetermined value (all low) during the evaluate phase (CLK high in the example) will the output value OUT transition to the active value (high). When Node 1 and Node 3 are high as a result of all inputs being low, the respective NFETs that are turned on by Node 1 and Node 3 will pull Node 2 low, resulting in OUT being high. If any input is high, at least one NFET in the NFET stack of the evaluation phase will be turned off and Node 2 will remain high, resulting in OUT being low. Node 1 and Node 3 are evaluated together by coupling Node 3 to an NFET that is added to the NFET stack of the evaluation phase.

The NOR decode unit 300 includes the first NOR decode circuit 302 that receives three inputs B0, B1, B2 (e.g., address bit inputs) respectively coupled to the gates of three decode NFETs N1, N2, N3. The inputs B0, B1, B2 are also respectively coupled to the gates of three decode PFETs P1, P2, P3 of a series PPET stack. The source of the first decode PFET P1 is connected to VDD and the drain of the final decode PFET P3 in the series stack is coupled to Node 1, which is the output node of the first NOR decode circuit 302. The decode NFETs N1, N2, N3 are connected in parallel between Node 1 and a clocked NFET N4 at Node 0 whose drain is connected to VSS or ground. Node 1 is also connected to a clocked PFET P4 that pre-charges Node 1 to VDD when the clock is inactive (i.e., Node 1 is high while the clock is low). In the example of FIG. 3, the clock is high active in that evaluation of the output of NOR decode circuit 302 occurs when the clock goes high and otherwise the NOR decode circuit 302 is held in a pre-charge state while the clock is low. In the example of FIG. 3, inputs B0, B1, B2 are low active inputs. As decode PFET P1 and decode NFET N1 are complimentary, they form a transmission gate for B0; as decode PFET P2 and decode NFET N2 are complimentary, they form a transmission gate for B1; and as decode PFET P3 and decode NFET N3 are complimentary, they form a transmission gate for B3. The outputs of these transmission gates are OR'd at Node 1, which is controlled by clocked PFET P4 and clocked NFET N4, in that the output of Node 1 is held high while PFET P4 is on and the clock is low, and Node 1 is evaluated when NFET N4 is on and the clock is high.

The NOR decode unit 300 also includes the second NOR decode circuit 304 that receives three inputs B3, B4, B5 (e.g., address bit inputs) respectively coupled to the gates of three decode NFETs N5, N6, N7. The inputs B3, B4, B5 are also respectively coupled to the gates of three decode PFETs P5, P6, P7 of a series PFET stack. The source of the first decode PFET P5 is connected to VDD and the drain of the final decode PFET P7 in the series stack is coupled to Node 3, which is the output node of the second NOR decode circuit 304. The decode NFETs N5, N6, N7 are connected in parallel between Node 3 and a clocked NFET N8 at Node 4 whose drain is connected to VSS or ground. Node 3 is also connected to a clocked PFET P8 that pre-charges Node 3 to VDD when the clock is inactive (i.e., Node 3 is high while the clock is low). As decode PFET P5 and decode NFET N5 are complimentary, they form a transmission gate for B3; as decode PFET P6 and decode NFET N6 are complimentary, they form a transmission gate for B4; and as decode PFET P7 and decode NFET N7 are complimentary, they form a transmission gate for B5. The outputs of these transmission gates are controlled by clocked PFET P8 and clocked NFET N8. These outputs are OR'd at Node 3.

The NOR decode unit 300 also includes an evaluation circuit 306 that evaluates the output of Node 1 and Node 3 when the clock rises from inactive to active and outputs the result at Node 2. The evaluation circuit 306 includes a series NFET stack that includes NFETs N9, N10, N11. NFET N9 is a clocked NFET whose source is connected to VSS or ground and drain is connected to NFET N10. The gate of NFET N10 is coupled to Node 1, and thus the output of the first NOR decode circuit 302 determines whether NFET N10 is turned off or on. As Node 1 is pre-charged to VDD, NFET N10 is biased to be on when the active clock signal triggers the evaluation phase. The source of NFET 10 is coupled to the drain of clocked NFET N9 and the drain of NFET N10 is coupled to the source of NFET N11. The gate of NFET N11 is coupled to Node 3, and thus the output of the second NOR decode circuit 304 determines whether NFET N11 is turned off or on. As Node 3 is pre-charged to VDD, NFET N11 is biased to be on when the active clock signal triggers the evaluation phase. The drain of NFET 11 is coupled to Node 2. Two PFETs P9, P10 are connected in parallel between VDD and Node 2. The gate of PFET P10 is driven by Node 1 and holds Node 2 high if NFET N10 is turned off (Node 1 goes low), while the gate of PFET P9 is driven by Node 3 and holds Node 2 high if NFET N11 is turned off (Node 3 goes low). Thus, if either Node 1 or Node 3 are low, Node 2 is pulled high. If both Node 1 and Node 3 are high, NFET 10 and NFET 11 will pull Node 2 low. Clocked PFET P11 is connected to VDD at its source and Node 2 at its drain to pre-charge Node 2 to VDD when the clock signal is low. PFET P11 turns off when the clock signal goes high, thus allowing the evaluated result at inverter INV, which provides the inversion of Node 2 as the output of the NOR decode unit 300. The output to NSHARE allows for current sharing with other NOR decode units (not shown here).

An example operation of the NOR decode unit 300 is now described when all inputs B0, B1, B2, B3, B4, B5 are low. A NOR truth table dictates that the output of the NOR decode unit should be '1' when all inputs are '0', which is now demonstrated. Beginning with the first NOR decode circuit 302, a low input of B0, B1, B2 to decode PFETs P1, P2, P3 and an inactive clock input to PFET P4 turns on PFETs P1, P2, P3, P4 and allows the pre-charge of Node 1 to VDD. A low input of B0, B1, B2 turns off decode NFETs N1, N2, N3. As Node 1 is pre-charged high, NFET N10 is turned on and PFET P10 is turned off. Node 2 is pre-charged to high by clocked PFET P11 while the clock is inactive and clocked NFET N9 is turned off. In decode circuit 304, a low input of B3, B4, B5 to decode PFETs P5, P6, P7 and an inactive clock input to PFET P8 turns on PFETs P5, P6, P7, P8 and allows the pre-charge of Node 3 to VDD. A low input of B3, B4, B5 turns off decode NFETs N5, N6, N7. As Node 3 is pre-charged high, NFET N11 is turned on and PFET P9 is turned off. When the clock rises from low to high, in NOR decode circuit 302, PFETs P1, P2, P3 remain on and NFETs N1, N2, N3 remain off. Clocked PFET P4 turns off to turn off the VDD supply but the VDD supply through the PFET stack keeps Node 1 high. In NOR decode circuit 304, PFETs P5, P6, P7 remain on and NFETs N5, N6, N7 remain off. Clocked PFET P8 turns off to turn off the VDD supply but the VDD supply through the PFET stack keeps Node 3 high.

In the evaluation circuit, clocked NFET N9 turns on when the clock goes from low to high in the evaluation phase, and clocked PFET P11 turns off to remove VDD at Node 2, thus allowing Node 2 to be pulled low depending on the value of Node 1 and Node 3. Because Node 1 is high, NFET N10 remains on to allow the pull of Node 2 down to low. Also, because Node 1 is high, PFET P10 turns off, thus also removing the supply of VDD. Because Node 3 is high, NFET N11 remains on to allow the pull of Node 2 down to low. Also, because Node 3 is high, PFET P9 turns off, thus also removing the supply of VDD. Because PFETs P9, P10, P11 are off and the supply of VDD is removed, Node 2 is pulled low through the NFET stack including NFETs N9, N10, N11. The low output at Node 2 is inverted by inverter INV, and the output of the NOR decode unit is high.

An example operation of the NOR decode unit 300 is now described when input B5 is high and all other inputs B0, B1, B2, B3, B4 are low. A NOR truth table dictates that the output of the NOR decode unit should be '0' when at least one input is '0', which is now demonstrated. Beginning with the first NOR decode circuit 302, the operation remains the same as described above. A low input of B0, B1, B2 to decode PFETs P1, P2, P3 and an inactive clock input to PFET P4 turns on PFETs P1, P2, P3, P4 and allows the pre-charge of Node 1 to VDD. A low input of B0, B1, B2 turns off decode NFETs N1, N2, N3. As Node 1 is pre-charged high, NFET N10 remains on and PFET P10 is turned off. Node 2 is pre-charged to high by PFET P11. In decode circuit 304, a low input of B3, B4 turns on decode PFETs P5, P6 and turns off decode NFETs N5, N6. The high input of B5 turns off PFET P7 and turns on NFET N7. However, the inactive clock input turns on PFET P8 and turns off NFET N8, and thus Node 3 is still pre-charged high as with the previous scenario. When the clock rises from low to high, in NOR decode circuit 302, PFETs P1, P2, P3 remain on and NFETs N1, N2, N3 remain off. Clocked PFET P4 turns off and clocked NFET N4 turns on, but Node 1 remains high through the VDD supplied by the PFET stack. In NOR decode circuit 304, PFETs P5, P6 remain on and PFET P7 remains off, while clocked PFET P8 turns off, and as such there is no VDD supply to Node 3 through the PFET stack or through PFET P8. NFETs N6, N7 remain off and NFET N5 turns on, while clocked NFET N8 turns on, thus pulling Node 4 and therefore Node 3 to low. Thus, Node 3 is low at evaluation.

In the evaluation circuit, when the clock rises from low to high, clocked PFET P11 is turned off and clocked NFET N9 is turned on, thus allowing Node 2 to be pulled down depending on the evaluation of Node 1 and Node 3. Because Node 1 is high, NFET N10 remains on. Also, because Node 1 is low, PFET P10 turns off, thus removing the supply of VDD. However, because Node 3 is low, NFET N11 turns off and does not allow the pull of Node 2 down to low. Also, because Node 3 is low, PFET P9 turns on, thus maintaining the supply of VDD at Node 2. Because NFET 11 is off, Node 2 cannot be pulled low through the NFET stack of the evaluation circuit. The high output at Node 2 is inverted by inverter INV, and the output of the NOR decode unit 300 is low.

In other words, if any input to either PFET stack of NOR decode circuit 302 or NOR decode circuit 304 is high, at least one NFET of the NFET stack will be turned off by at least one output node of a NOR decode circuit. Thus, the output of the evaluation circuit will be maintained at high, which is then inverted before output by the NOR decode unit 300.

Thus, it can be seen that the addition of an NFET (NFET 11) to the NFET stack and the addition of a corresponding complimentary PFET (PFET 9) allow the inclusion of the additional NOR decode circuit, thus allowing more than four inputs. This obviates the need for a pre-decoder to achieve 4+ input decoding. Although one extra gate delay is introduced, the extra delay is much smaller than the additional setup and clock cycle time needed for separate pre-decode and decode stages. Moreover, the NOR decode unit described above conserves space compared to a two-stage NOR decoder. The result is faster, more efficient, and more compact NOR decoder for large fan-in decode structures.

Figure 4:
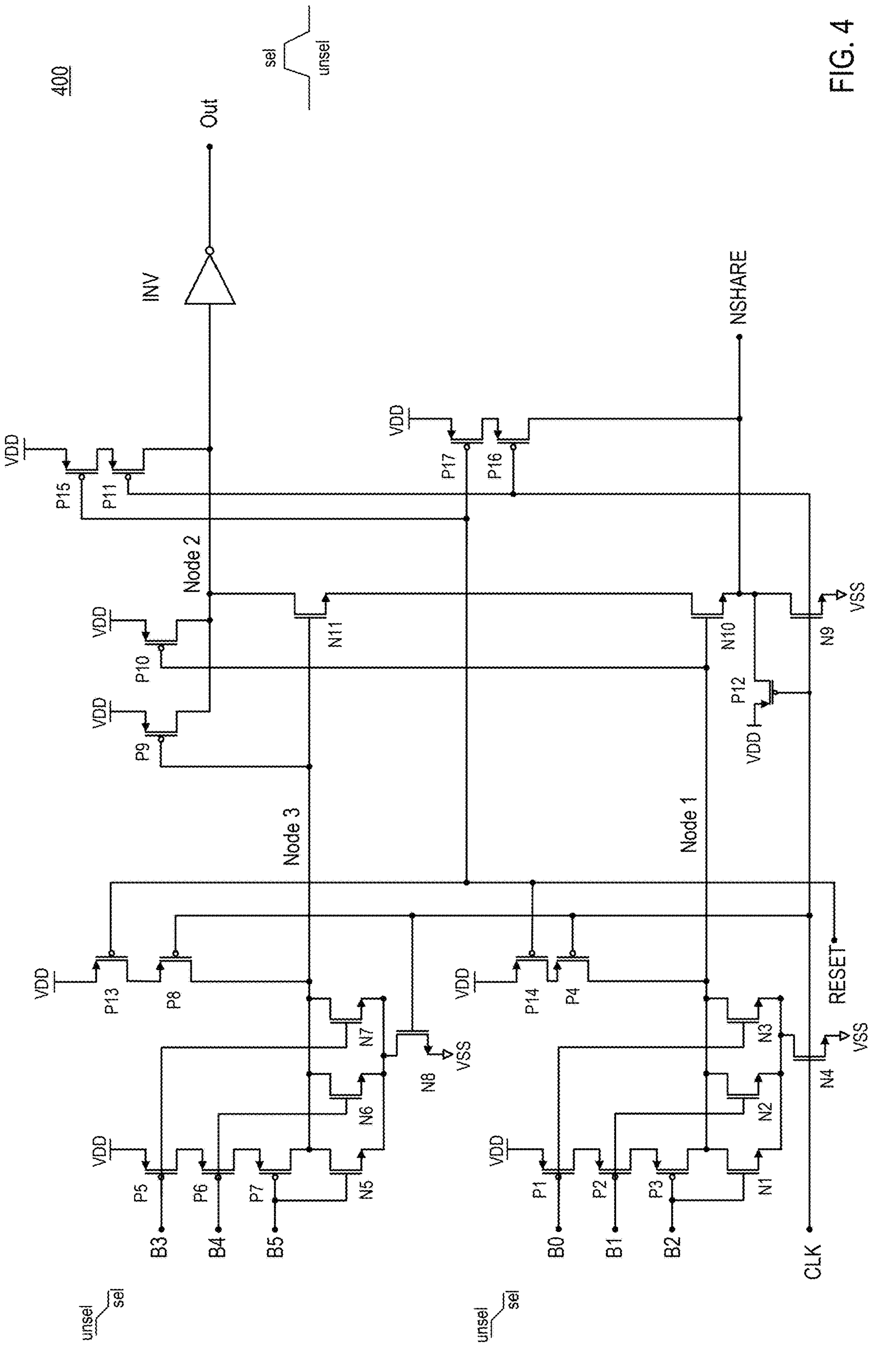
FIG. 4 sets forth a circuit diagram of another example NOR decoder for large decode structures in accordance with at least one embodiment of the present disclosure.

For further explanation, FIG. 4 sets forth a circuit diagram of an example NOR decode unit 400 of an example NOR decoder for large decode structures in accordance with at least one embodiment of the present disclosure. The example NOR decode unit 400 extends the NOR decode unit 300 of FIG. 3, where like references identify like elements, except that NOR decode unit 400 includes a reset signal to allow for wider pulse widths. The reset of the NOR decode unit 400 is achieved by a reset PFET P14 in series with clocked PFET P4, a reset PFET P13 in series with clocked PFET P8, and a reset PFET P15 in series with clocked PFET P11. The gates of reset PFETs P13, P14, P15 are driven by a RESET signal. In some examples, a clocked PFET P16 and a reset PFET P17 are coupled to NSHARE.

Figure 5:
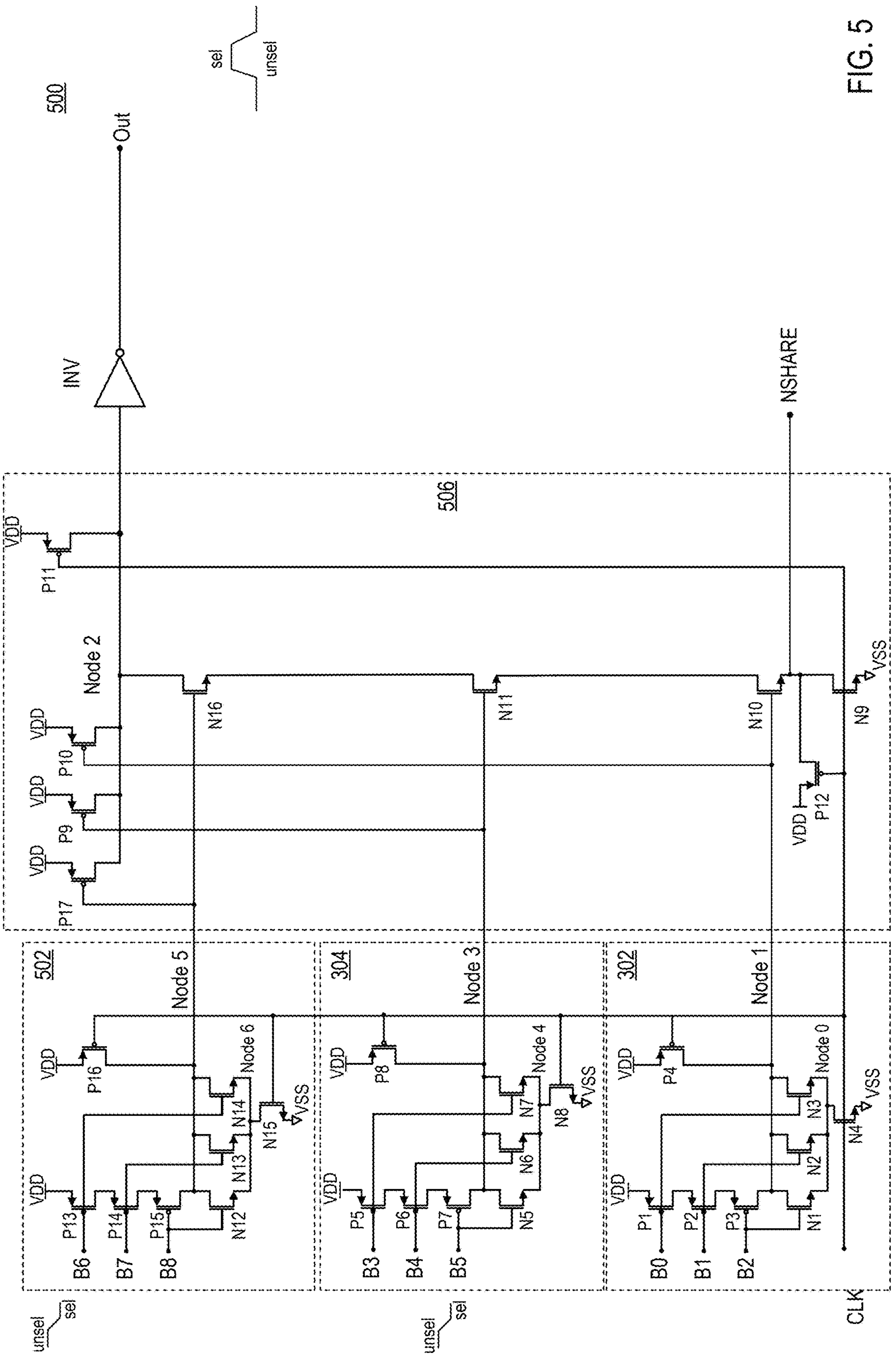
FIG. 5 sets forth a circuit diagram of another example NOR decoder for large decode structures in accordance with at least one embodiment of the present disclosure.

For further explanation, FIG. 5 sets forth a circuit diagram of an example NOR decode unit 500 of an example NOR decoder for large decode structures in accordance with at least one embodiment of the present disclosure. The example NOR decode unit 500 of FIG. 5 is operable to provide single stage NOR decode for a 9-to-256 decode scheme. The NOR decode unit 500 includes the first NOR decode circuit 302 and the second NOR decode circuit 304 of FIG. 2. The NOR decode unit 300 also includes a third NOR decode circuit 502 that receives three inputs B6, B7, B8 (e.g., address bit inputs) respectively coupled to the gates of three decode NFETs N12, N13, N14. The inputs B6, B7, B8 are also respectively coupled to the gates of three decode PFETs P13, P14, P15 of a series PFET stack. The source of the first decode PFET P13 is connected to VDD and the drain of the final decode PFET P15 in the series stack is coupled to Node 5, which is the output node of the third NOR decode circuit 502. The decode NFETs N12, N13, N14 are connected in parallel between Node 5 and a clocked NFET N15 at Node 6 whose drain is connected to VSS or ground. Node 5 is also connected to a clocked PFET P16 that pre-charges Node 1 to VDD when the clock is inactive (i.e., Node 5 is high while the clock is low). In the example of FIG. 5, the clock is high active and inputs B6, B7, B8 are low active inputs. As decode PFET P13 and decode NFET N12 are complimentary, they form a transmission gate for B5; as decode PFET P14 and decode NFET N13 are complimentary, they form a transmission gate for B6; and as decode PFET P15 and decode NFET N14 are complimentary, they form a transmission gate for B7. The outputs of these transmission gates are controlled by the clocked PFET P16 and clocked NFET N15. These outputs are OR'd at Node 5.

The NOR decode unit 500 also includes an evaluation circuit 506, similar to the evaluation circuit 306 of FIG. 3, that evaluates the output of Node 1, Node 3, and Node 5 when the clock rises from inactive to active and outputs the result at Node 2. The evaluation circuit 506 includes a series NFET stack that includes NFETs N9, N10, N11, N16. NFET N9 is a clocked NFET whose source is connected to VSS or ground and drain is connected to NFET 10. The gate of NFET N10 is coupled to Node 1, and thus the output of the first NOR decode circuit 302 determines whether NFET N10 is turned off or on. The source of NFET 10 is coupled to the drain of clocked NFET N9 and the drain of NFET N10 is coupled to the source of NFET N11. The gate of NFET N11 is coupled to Node 3, and thus the output of the second NOR decode circuit 304 determines whether NFET N11 is turned off or on. The drain of NFET 11 is coupled to NFET N16. The gate of NFET N16 is coupled to Node 5, and thus the output of the third NOR decode circuit 502 determines whether NFET N16 is turned off or on. The drain of NFET 16 is coupled to Node 2. Three PFETs P9, P10, P17 are connected in parallel between VDD and Node 2. The gate of PFET P10 is driven by Node 1 and therefore compliments NFET N10 by holding Node 2 high when NFET N10 is turned off, the gate of PFET P9 is driven by Node 3 and therefore compliments NFET N11 by holding Node 2 high when NFET N11 is turned off, and the gate of PFET P17 is driven by Node 5 and therefore compliments NFET N16 by holding Node 2 high when NFET N16 is turned off. Thus, PFET P10 pulls Node 2 high when Node 1 is low, PFET P9 pulls Node 2 high when Node 3 is low, and PFET P17 pulls Node 2 high when Node 5 is low. If any of Node 1, Node 3, or Node 5 are low, Node 2 is pulled high. If Node 1, Node 3, and Node 5 are all high, the NFET stack (including NFET N10, NFET N11, and NFET N16) pulls Node 2 low. Clocked PFET P11 is connected to VDD at its source and Node 2 at its drain to pre-charge Node 2 to VDD when the clock signal is high. PFET P11 turns off when the clock signal goes high, thus allowing the evaluated result at inverter INV, which provides the inversion of Node 2 as the output of the NOR decode unit 500. The output to NSHARE allows for current sharing with other NOR decode units (not shown here).

An example operation of the NOR decode unit 500 is now described when all inputs B0, B1, B2, B3, B4, B5, B6, B7, B8 are low. A NOR truth table dictates that the output of the NOR decode unit should be '1' when all inputs are '0', which is now demonstrated. Beginning with the first NOR decode circuit 302, a low input of B0, B1, B2 to decode PFETs P1, P2, P3 and an inactive clock input to PFET P4 turns on PFETs P1, P2, P3, P4 and allows the pre-charge of Node 1 to VDD. A low input of B0, B1, B2 turns off decode NFETs N1, N2, N3. As Node 1 is pre-charged high, NFET N10 is turned on and NFET N9 is turned off, thus pre-charging Node 2 to high via PFET P11. In decode circuit 304, a low input of B3, B4, B5 to decode PFETs P5, P6, P7 and an inactive clock input to PFET P8 turns on PFETs P5, P6, P7, P8 and allows the pre-charge of Node 3 to VDD. A low input of B3, B4, B5 turns off decode NFETs N5, N6, N7. As Node 3 is pre-charged high, NFET N11 is turned on. In decode circuit 502, a low input of B6, B7, B8 to decode PFETs P13, P14, P15 and an inactive clock input to PFET P16 turns on PFETs P13, P14, P15, P16 and allows the pre-charge of Node 5 to VDD. A low input of B6, B7, B8 turns off decode NFETs N12, N13, N14. As Node 5 is pre-charged high, NFET N16 is turned on. When the clock rises from low to high, in NOR decode circuit 302, PFETs P1, P2, P3 remain on and NFETs N1, N2, N3 remain off. Clocked PFET P4 turns off to turn off the VDD supply and clocked NFET N4 turns on, however Node 1 remains high through the VDD supplied by the PFET stack. In NOR decode circuit 304, PFETs P5, P6, P7 remain on and NFETs N5, N6, N7 remain off. Clocked PFET P8 turns off to turn off the VDD supply and clocked NFET N8 turns on however Node 3 remains high through the VDD supplied by the PFET stack. Thus, Node 3 remains high. In NOR decode circuit 502, PFETs P13, P14, P15 remain on and NFETs N12, N13, N14 remain off. Clocked PFET P16 turns off to turn off the VDD supply and clocked NFET N15 turns on, however Node 5 remains high through the VDD supplied by the PFET stack. Thus, Node 5 remains high.

In the evaluation circuit, clocked PFET P11 is turned off and clocked NFET N9 is turned on, thus allowing Node 2 to be pulled down or up depending on the evaluation of Node 1, Node 3, and Node 5. Because Node 1 is high, NFET N10 remains high on to allow the pull of Node 2 down to low. Also, because Node 1 is high, PFET P10 turns off, thus removing the supply of VDD. Because Node 3 is high, NFET N11 remains on to allow the pull of Node 2 down to low. Also, because Node 3 is high, PFET P9 turns off, thus removing the supply of VDD. Because Node 5 is high, NFET N16 remains low to allow the pull of Node 2 down to low. Also, because Node 5 is high, PFET P17 turns off, thus removing the supply of VDD. Because PFETs P9, P10, P11, P17 are off, thus removing the supply of VDD, Node 2 is pulled low through the NFET stack including NFETs N9, N10, N11, N16. The low output at Node 2 is inverted by inverter INV, and the output of the NOR decode unit is high.

An example operation of the NOR decode unit 500 is now described when all inputs B0, B1, B2, B3, B4, B5, B6, B7, B8 are high. A NOR truth table dictates that the output of the NOR decode unit should be '0' when all inputs are '1', which is now demonstrated. Beginning with the first NOR decode circuit 302, a high input of B0, B1, B2 turns off decode PFETs P1, P2, P3. The inactive clock signal turns PFET P4 on to pre-charge Node 1 to VDD. A high input of B0, B1, B2 turns on decode NFETs N1, N2, N3. As Node 1 is pre-charged high, NFET N10 is turned on and PFET P10 is turned off. In decode circuit 304, a high input of B3, B4, B5 turns off decode PFETs P5, P6, P7. The inactive clock signal turns PFET P8 on to pre-charge Node 3 to VDD. A high input of B3, B4, B5 turns on decode NFETs N5, N6, N7. As Node 3 is pre-charged high, NFET N11 is turned on and PFET P9 is turned off. In decode circuit 502, a high input of B6, B7, B8 turns off decode PFETs P13, P14, P15. The inactive clock signal turns PFET P16 on to pre-charge Node 5 to VDD. A high input of B6, B7, B8 turns on decode NFETs N12, N13, N14. As Node 5 is pre-charged high, NFET N16 is turned on and PFET P17 is turned off. When the clock rises from low to high, in NOR decode circuit 302, PFETs P1, P2, P3 remain off and NFETs N1, N2, N3 remain on. Thus Node 1 is pulled low. In NOR decode circuit 304, PFETs P5, P6, P7 remain off and NFETs N5, N6, N7 remain on. Thus, Node 3 is pulled low. In NOR decode circuit 502, PFETs P13, P14, P15 remain off and NFETs N12, N13, N14 remain on. Thus, Node 5 is pulled low.

In the evaluation circuit, clocked PFET P11 is turned off and clocked NFET N9 is turned on, thus allowing Node 2 to be pulled down or up depending on the evaluation of Node 1, Node 3, and Node 5. Because Node 1, Node 3, and Node 5 are all low, NFETs N10, N11, N16 are all off, thus Node 2 cannot be pulled low. Node 2 remains high, which is inverted by inverter INV, and the output of the NOR decode unit is low.

Thus, it can be seen that the addition of two NFETs (NFET 11 and NFET 16) to the NFET stack and the addition of corresponding complimentary PFETs (PFET 9, PFET 17) allow the inclusion of two additional NOR decode circuits, thus allowing more than four inputs without a pre-decode stage. Although two extra gate delays are introduced, the extra delay is much smaller than the additional setup and clock cycle time needed for separate pre-decode and decode stages. Moreover, the NOR decode unit described above conserves space compared to a two-stage NOR decoder. The result is faster, more efficient, and more compact NOR decoder for large fan-in decode structures. It will be appreciated that principles of the present disclosure can be extended to a 12-to-4096 decoding scheme without the addition of a pre-decoder.

In a particular example, principles of the present disclosure are applicable to the complimentary NOR-NAND decoder described in U.S. Pat. No. 10,374,604, assigned to International Business Machines Corporation and incorporated by reference herein. The complimentary NOR-NAND decoder includes a clocked NFET pre-charge transistor connected to a first power source (VSS) and a first node. The clocked NFET pre-charge transistor includes a gate configured to receive a low active evaluation clock signal that is low during an evaluation phase. The NOR-NAND decoder also includes a clocked PFET transistor connected to a second power source (VDD) and having a gate configured to receive the low active evaluation clock signal. The NOR-NAND decoder also includes a decode circuit that is configured to decode a plurality of inputs to pull the first node to a low state based on the plurality of inputs being in a predetermined state, and that is configured to not pull the first node to the low state based on the plurality of inputs not being in the predetermined state. The NOR-NAND decoder also includes an evaluation circuit including a first NFET transistor serially connected to a first PFET transistor by a second node. The first PFET transistor is connected between the clocked PFET and the second node and includes a gate connected to the first node. The first NFET transistor is connected between VSS and the second node and includes a gate connected to the first node. In the NOR-NAND decoder, the first node is pre-charged low by an NFET stack when the clock is inactive (high). If all inputs are high, the first node remains low via the VSS power source connected to the NFET stack. This turns on the PFET in the evaluation phase, which then supplies VDD at the second node and the output OUT is high. Otherwise, the NFET in the evaluation phase is turned on, and the output is pulled low. In accordance with the present disclosure, another decode circuit with additional inputs can be added by adding a second PFET and a second NFET to the evaluation phase and connecting the gates of these transistors to a third node that receives a second set of inputs.

Figure 6:
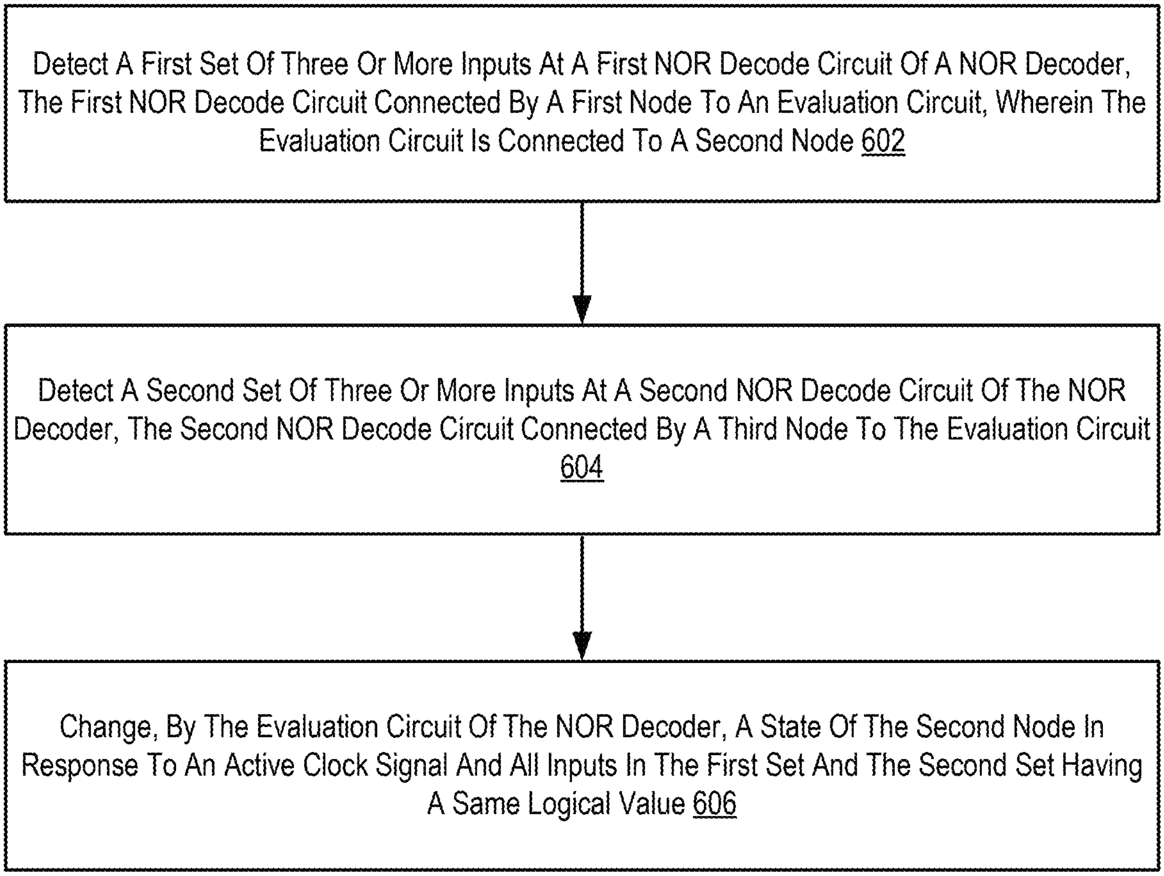
FIG. 6 sets forth a flow chart of an example method of a NOR decoder for large decode structures in accordance with at least one embodiment of the present disclosure.

For further explanation, FIG. 6 sets forth a flow chart of an example method of a NOR decoder for large decode structures in accordance with at least one embodiment of the present disclosure. The example method of FIG. 6 includes detecting 602 a first set of three or more inputs at a first NOR decode circuit of a NOR decoder, the first NOR decode circuit connected by a first node to an evaluation circuit, wherein the evaluation circuit is connected to a second node. For example, the first NOR decode circuit can be the NOR decode circuit 302 of FIG. 3 and the evaluation circuit can be the evaluation circuit 306 in FIG. 3. The three or more inputs can correspond to inputs B0, B1, B2, although it will be appreciated that another input can be added without violating a design rule against four PFETs in a stack.

The method of FIG. 6 also includes detecting 604 a second set of three or more inputs at a second NOR decode circuit of the NOR decoder, the second NOR decode circuit connected by a third node to the evaluation circuit. For example, the second NOR decode circuit can be the NOR decode circuit 304 of FIG. 3. The three or more inputs can correspond to inputs B3, B4, B5, although it will be appreciated that another input can be added without violating a design rule against four PFETs in a stack.

The method of FIG. 6 also includes pulling 606 down, by the evaluation circuit of the NOR decoder, the second node to low in response to an active clock signal and all inputs in the first set and the second set being low. As discussed above, the output node of each of the first NOR decode circuit and the second NOR decode circuit controls a respective NFET in an NFET stack connected to the second node. When all inputs are low, all NFETs in the NFET stack are turned on thus allowing the second node to be pulled low. The second node drives the output of the NOR decoder, which can be inverted to produce a high output. If any input is high, at least one NFET in the NFET stack is turned off, thus preventing the second node from being pulled low.

In view of the foregoing, it will be appreciated that the NOR decoder for large decode structures of the present disclosure allows for larger number of inputs with only an "NFET" stack performance penalty (i.e., by moving the evaluation from NAND2 to NAND3). Further, the NOR decoder for large decode structures allows for large "single stage" decodes schemes ranging from 6-to-64, 9-to-512 and even 12-to-4096 decode schemes. The NOR decoder for large decode structures can also be used for smaller decoders while using extra inputs as "enable" inputs. For example, additional inputs can enable decoding only for "read" or "write" modes of operation, and so on.

In view of the foregoing, it will be appreciated that embodiments of the present disclosure provide a number of advantages that can increase the performance of address decoders for memory devices. One such embodiment is directed to a NOR decoder for large decode structures that includes a first NOR decode circuit connected by a first node to an evaluation circuit. The first NOR decode circuit is configured to receive a first set of three or more inputs. The evaluation circuit is connected to a second node. The NOR decoder also includes a second NOR decode circuit connected by a third node to the evaluation circuit. The second NOR decode circuit is configured to receive a second set of three or more inputs. Thus, a portion of the inputs, for example a portion of an address, are provided to the first NOR decode circuit and a second portion of the inputs are provided to the second NOR decode circuit. The evaluation circuit is configured to change a state of the second node to low in response to an active clock signal and all inputs in the first set and the second set having the same logical value. In a particular example, the second node is pulled from high to low in response to all inputs of the first set and the second set being low. The second node may be coupled to an output node by an inverter. The NOR decoder does not utilize pre-decoding. That is, the first NOR decode circuit, the second NOR decode circuit, and the evaluation circuit compose a single stage. In this manner, the addition of one NFET to the NFET stack and the addition of one corresponding complimentary PFET allow the inclusion of the additional NOR decode circuit, thus allowing more than four inputs. This obviates the need for a pre-decoder to achieve 5+ input decoding. Although one extra gate delay is introduced, the extra delay is much smaller than the additional setup and clock cycle time needed for separate pre-decode and decode stages. Moreover, the NOR decode unit described above conserves space compared to a two-stage NOR decoder. The result is faster, more efficient, and more compact NOR decoder for large fan-in decode structures.

In some examples, the first NOR decode circuit includes a first stack of p-type field effect transistors (PFETs) connected in series between a voltage source and the first node. The three or more inputs being received by respective PFETs in the first stack of PFETs. The first NOR decode circuit also includes a first array of n-type field effect transistors (NFETs) connected in parallel between a first clocked NFET and the first node. The three or more inputs are also received by respective NFETs of the first array of NFETs. In these examples, the NOR decode also includes a second NOR decode circuit that includes a second stack of PFETs connected in series between the voltage source and the third node. The three or more inputs to the second NOR decode circuit are received by respective PFETs in the second stack of PFETs. The second NOR decode circuit also includes a second array of NFETs connected in parallel between a second clocked NFET and the third node. The three or more inputs are received by respective NFETs of the second array of NFETs.

In some examples, the evaluation circuit includes an NFET stack that includes a clocked evaluation NFET, a first evaluation NFET controlled by the first node, and a second evaluation NFET controlled by the third node. In some implementations, an array of PFETs is connected in parallel between a voltage source and the second node. The array of PFETs include a first PFET controlled by the clock signal, a second PFET controlled by the first node, and a third PFET controlled by the third node.

In some examples, the NOR decoder includes a third NOR decode circuit connected by a fourth node to the evaluation circuit. The third NOR decode circuit is configured to receive a third set of three or more inputs. In implementations, the evaluation circuit includes an NFET stack. In these variations, the NFET stack includes a clocked evaluation NFET, a first evaluation NFET controlled by the first node, a second evaluation NFET controlled by the third node, and a third evaluation NFET controlled by the fourth node.

In some implementations, the NOR decoder includes a reset input. In some implementations, the NOR decoder utilizes a high active evaluation clock signal. The high active evaluation clock signal is low during a pre-charge phase and high during an evaluation phase. In other examples, the NOR decoder is a complimentary NOR-NAND decoder.

Another embodiment is directed to an apparatus that includes memory array and a NOR decoder for accessing the memory array. The NOR decoder includes a first NOR decode circuit connected by a first node to an evaluation circuit. The first NOR decode circuit is configured to receive a first set of three or more inputs. The evaluation circuit is connected to a second node. The NOR decoder also includes a second NOR decode circuit connected by a third node to the evaluation circuit. The second NOR decode circuit is configured to receive a second set of three or more inputs. Thus, a portion of the inputs, for example a portion of an address, are provided to the first NOR decode circuit and a second portion of the inputs are provided to the second NOR decode circuit. The evaluation circuit is configured to change a state of the second node to low in response to an active clock signal and all inputs in the first set and the second set having the same logical value. The NOR decoder does not utilize pre-decoding. The first NOR decode circuit, the second NOR decode circuit, and the evaluation circuit compose a single stage.

Another embodiment is directed to a method of a NOR decoder for large decode structures. The method includes detecting a first set of three or more inputs at a first NOR decode circuit of a NOR decoder. The first NOR decode circuit is connected by a first node to an evaluation circuit and the evaluation circuit is connected to a second node. The method also includes detecting a second set of three or more inputs at a second NOR decode circuit of the NOR decoder. The second NOR decode circuit is connected by a third node to the evaluation circuit. The method also includes changing, by the evaluation circuit of the NOR decoder, a state of the second node in response to an active clock signal and all inputs in the first set and the second set having the same logical value. A decode result based on all of the inputs is obtained in a single stage without pre-decoding.

Figure 7:
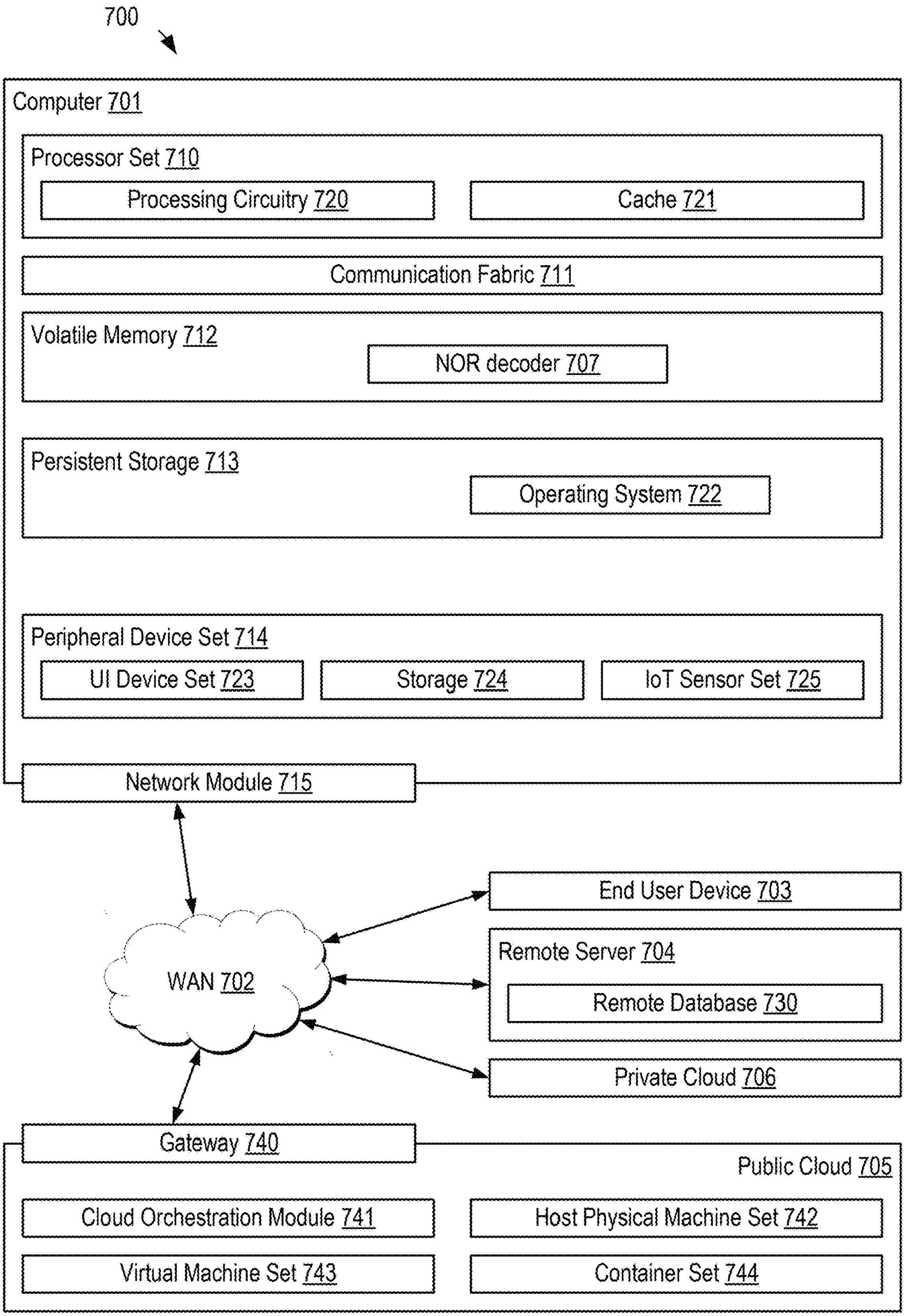
FIG. 7 sets forth an example computing environment according to aspects of the present disclosure.

FIG. 7 sets forth an example computing environment according to aspects of the present disclosure. Computing environment 700 includes, for example, computer 701, wide area network (WAN) 702, end user device (EUD) 703, remote server 704, public cloud 705, and private cloud 706. In this embodiment, computer 701 includes processor set 710 (including processing circuitry 720 and cache 721), communication fabric 711, volatile memory 712, persistent storage 713 (including operating system 722), peripheral device set 714 (including user interface (UI) device set 723, storage 724, and Internet of Things (IoT) sensor set 725), and network module 715. Remote server 704 includes remote database 730. Public cloud 705 includes gateway 740, cloud orchestration module 741, host physical machine set 742, virtual machine set 743, and container set 744.

Computer 701 may take the form of a desktop computer, laptop computer, tablet computer, smart phone, smart watch or other wearable computer, mainframe computer, quantum computer or any other form of computer or mobile device now known or to be developed in the future that is capable of running a program, accessing a network or querying a database, such as remote database 730. As is well understood in the art of computer technology, and depending upon the technology, performance of a computer-implemented method may be distributed among multiple computers and/or between multiple locations. On the other hand, in this presentation of computing environment 700, detailed discussion is focused on a single computer, specifically computer 701, to keep the presentation as simple as possible. Computer 701 may be located in a cloud, even though it is not shown in a cloud in FIG. 7. On the other hand, computer 701 is not required to be in a cloud except to any extent as may be affirmatively indicated.

Processor set 710 includes one, or more, computer processors of any type now known or to be developed in the future. Processing circuitry 720 may be distributed over multiple packages, for example, multiple, coordinated integrated circuit chips. Processing circuitry 720 may implement multiple processor threads and/or multiple processor cores. Cache 721 is memory that is located in the processor chip package(s) and is typically used for data or code that should be available for rapid access by the threads or cores running on processor set 710. Cache memories are typically organized into multiple levels depending upon relative proximity to the processing circuitry. Alternatively, some, or all, of the cache for the processor set may be located "off chip." In some computing environments, processor set 710 may be designed for working with qubits and performing quantum computing.

Computer readable program instructions are typically loaded onto computer 701 to cause a series of operational steps to be performed by processor set 710 of computer 701 and thereby effect a computer-implemented method, such that the instructions thus executed will instantiate the methods specified in flowcharts and/or narrative descriptions of computer-implemented methods included in this document. These computer readable program instructions are stored in various types of computer readable storage media, such as cache 721 and the other storage media discussed below. The program instructions, and associated data, are accessed by processor set 710 to control and direct performance of the computer-implemented methods.

Communication fabric 711 is the signal conduction path that allows the various components of computer 701 to communicate with each other. Typically, this fabric is made of switches and electrically conductive paths, such as the switches and electrically conductive paths that make up buses, bridges, physical input/output ports and the like. Other types of signal communication paths may be used, such as fiber optic communication paths and/or wireless communication paths.

Volatile memory 712 is any type of volatile memory now known or to be developed in the future. Examples include dynamic type random access memory (RAM) or static type RAM. Typically, volatile memory 712 is characterized by random access, but this is not required unless affirmatively indicated. In computer 701, the volatile memory 712 is located in a single package and is internal to computer 701, but, alternatively or additionally, the volatile memory may be distributed over multiple packages and/or located externally with respect to computer 701. The volatile memory includes a NOR decoder 707 for large decode structures. The NOR decoder employs one or more decode units such as any of the decode units of FIG. 3 to FIG. 6.

Persistent storage 713 is any form of non-volatile storage for computers that is now known or to be developed in the future. The non-volatility of this storage means that the stored data is maintained regardless of whether power is being supplied to computer 701 and/or directly to persistent storage 713. Persistent storage 713 may be a read only memory (ROM), but typically at least a portion of the persistent storage allows writing of data, deletion of data and re-writing of data. Some familiar forms of persistent storage include magnetic disks and solid state storage devices. Operating system 722 may take several forms, such as various known proprietary operating systems or open source Portable Operating System Interface-type operating systems that employ a kernel.

Peripheral device set 714 includes the set of peripheral devices of computer 701. Data communication connections between the peripheral devices and the other components of computer 701 may be implemented in various ways, such as Bluetooth connections, Near-Field Communication (NFC) connections, connections made by cables (such as universal serial bus (USB) type cables), insertion-type connections (for example, secure digital (SD) card), connections made through local area communication networks and even connections made through wide area networks such as the internet. In various embodiments, UI device set 723 may include components such as a display screen, speaker, microphone, wearable devices (such as goggles and smart watches), keyboard, mouse, printer, touchpad, game controllers, and haptic devices. Storage 724 is external storage, such as an external hard drive, or insertable storage, such as an SD card. Storage 724 may be persistent and/or volatile. In some embodiments, storage 724 may take the form of a quantum computing storage device for storing data in the form of qubits. In embodiments where computer 701 is required to have a large amount of storage (for example, where computer 701 locally stores and manages a large database), this storage may be provided by peripheral storage devices designed for storing very large amounts of data, such as a storage area network (SAN) that is shared by multiple, geographically distributed computers. IoT sensor set 725 is made up of sensors that can be used in Internet of Things applications. For example, one sensor may be a thermometer and another sensor may be a motion detector.

Network module 715 is the collection of computer software, hardware, and firmware that allows computer 701 to communicate with other computers through WAN 702. Network module 715 may include hardware, such as modems or Wi-Fi signal transceivers, software for packetizing and/or de-packetizing data for communication network transmission, and/or web browser software for communicating data over the internet. In some embodiments, network control functions and network forwarding functions of network module 715 are performed on the same physical hardware device. In other embodiments (for example, embodiments that utilize software-defined networking (SDN)), the control functions and the forwarding functions of network module 715 are performed on physically separate devices, such that the control functions manage several different network hardware devices. Computer readable program instructions for performing the computer-implemented methods can typically be downloaded to computer 701 from an external computer or external storage device through a network adapter card or network interface included in network module 715.

WAN 702 is any wide area network (for example, the internet) capable of communicating computer data over non-local distances by any technology for communicating computer data, now known or to be developed in the future. In some embodiments, the WAN 702 may be replaced and/or supplemented by local area networks (LANs) designed to communicate data between devices located in a local area, such as a Wi-Fi network. The WAN and/or LANs typically include computer hardware such as copper transmission cables, optical transmission fibers, wireless transmission, routers, firewalls, switches, gateway computers and edge servers.

End user device (EUD) 703 is any computer system that is used and controlled by an end user (for example, a customer of an enterprise that operates computer 701), and may take any of the forms discussed above in connection with computer 701. EUD 703 typically receives helpful and useful data from the operations of computer 701. For example, in a hypothetical case where computer 701 is designed to provide a recommendation to an end user, this recommendation would typically be communicated from network module 715 of computer 701 through WAN 702 to EUD 703. In this way, EUD 703 can display, or otherwise present, the recommendation to an end user. In some embodiments, EUD 703 may be a client device, such as thin client, heavy client, mainframe computer, desktop computer and so on.

Remote server 704 is any computer system that serves at least some data and/or functionality to computer 701. Remote server 704 may be controlled and used by the same entity that operates computer 701. Remote server 704 represents the machine(s) that collect and store helpful and useful data for use by other computers, such as computer 701. For example, in a hypothetical case where computer 701 is designed and programmed to provide a recommendation based on historical data, then this historical data may be provided to computer 701 from remote database 730 of remote server 704.

Public cloud 705 is any computer system available for use by multiple entities that provides on-demand availability of computer system resources and/or other computer capabilities, especially data storage (cloud storage) and computing power, without direct active management by the user. Cloud computing typically leverages sharing of resources to achieve coherence and economies of scale. The direct and active management of the computing resources of public cloud 705 is performed by the computer hardware and/or software of cloud orchestration module 741. The computing resources provided by public cloud 705 are typically implemented by virtual computing environments that run on various computers making up the computers of host physical machine set 742, which is the universe of physical computers in and/or available to public cloud 705. The virtual computing environments (VCEs) typically take the form of virtual machines from virtual machine set 743 and/or containers from container set 744. It is understood that these VCEs may be stored as images and may be transferred among and between the various physical machine hosts, either as images or after instantiation of the VCE. Cloud orchestration module 741 manages the transfer and storage of images, deploys new instantiations of VCEs and manages active instantiations of VCE deployments. Gateway 740 is the collection of computer software, hardware, and firmware that allows public cloud 705 to communicate through WAN 702.

Some further explanation of virtualized computing environments (VCEs) will now be provided. VCEs can be stored as "images." A new active instance of the VCE can be instantiated from the image. Two familiar types of VCEs are virtual machines and containers. A container is a VCE that uses operating-system-level virtualization. This refers to an operating system feature in which the kernel allows the existence of multiple isolated user-space instances, called containers. These isolated user-space instances typically behave as real computers from the point of view of programs running in them. A computer program running on an ordinary operating system can utilize all resources of that computer, such as connected devices, files and folders, network shares, CPU power, and quantifiable hardware capabilities. However, programs running inside a container can only use the contents of the container and devices assigned to the container, a feature which is known as containerization.

Private cloud 706 is similar to public cloud 705, except that the computing resources are only available for use by a single enterprise. While private cloud 706 is depicted as being in communication with WAN 702, in other embodiments a private cloud may be disconnected from the internet entirely and only accessible through a local/private network. A hybrid cloud is a composition of multiple clouds of different types (for example, private, community or public cloud types), often respectively implemented by different vendors. Each of the multiple clouds remains a separate and discrete entity, but the larger hybrid cloud architecture is bound together by standardized or proprietary technology that enables orchestration, management, and/or data/application portability between the multiple constituent clouds. In this embodiment, public cloud 705 and private cloud 706 are both part of a larger hybrid cloud.

Various aspects of the present disclosure are described by narrative text, flowcharts, block diagrams of computer systems and/or block diagrams of the machine logic included in computer program product (CPP) embodiments. With respect to any flowcharts, depending upon the technology involved, the operations can be performed in a different order than what is shown in a given flowchart. For example, again depending upon the technology involved, two operations shown in successive flowchart blocks may be performed in reverse order, as a single integrated step, concurrently, or in a manner at least partially overlapping in time.

A computer program product embodiment ("CPP embodiment" or "CPP") is a term used in the present disclosure to describe any set of one, or more, storage media (also called "mediums") collectively included in a set of one, or more, storage devices that collectively include machine readable code corresponding to instructions and/or data for performing computer operations specified in a given CPP claim. A "storage device" is any tangible device that can retain and store instructions for use by a computer processor. Without limitation, the computer readable storage medium may be an electronic storage medium, a magnetic storage medium, an optical storage medium, an electromagnetic storage medium, a semiconductor storage medium, a mechanical storage medium, or any suitable combination of the foregoing. Some known types of storage devices that include these mediums include: diskette, hard disk, random access memory (RAM), read-only memory (ROM), erasable programmable read-only memory (EPROM or Flash memory), static random access memory (SRAM), compact disc read-only memory (CD-ROM), digital versatile disk (DVD), memory stick, floppy disk, mechanically encoded device (such as punch cards or pits/lands formed in a major surface of a disc) or any suitable combination of the foregoing. A computer readable storage medium, as that term is used in the present disclosure, is not to be construed as storage in the form of transitory signals per se, such as radio waves or other freely propagating electromagnetic waves, electromagnetic waves propagating through a waveguide, light pulses passing through a fiber optic cable, electrical signals communicated through a wire, and/or other transmission media. As will be understood by those of skill in the art, data is typically moved at some occasional points in time during normal operations of a storage device, such as during access, de-fragmentation or garbage collection, but this does not render the storage device as transitory because the data is not transitory while it is stored.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A NOR decoder comprising:

a first NOR decode circuit connected by a first node to an evaluation circuit, the first NOR decode circuit being configured to receive a first set of three or more inputs, wherein the evaluation circuit is connected to a second node; and a second NOR decode circuit connected by a third node to the evaluation circuit, the second NOR decode circuit being configured to receive a second set of three or more inputs, wherein the evaluation circuit is configured to change a state of the second node in response to an active clock signal and all inputs in the first set and the second set having a same logical value, wherein the first NOR decode circuit, the second NOR decode circuit, and the evaluation circuit compose a single stage.

2. The NOR decoder of claim 1, wherein the first NOR decode circuit includes:

a first stack of p-type field effect transistors (PFETs) connected in series between a voltage source and the first node, the first set of three or more inputs being received by respective PFETs in the first stack of PFETs; and a first array of n-type field effect transistors (NFETs) connected in parallel between a first clocked NFET and the first node, the first set of three or more inputs being received by respective NFETs of the first array of NFETs;

wherein the second NOR decode circuit includes:

a second stack of PFETs connected in series between the voltage source and the third node, the second set of three or more inputs being received by respective PFETs in the second stack of PFETs; and a second array of NFETs connected in parallel between a second clocked NFET and the third node, the second set of three or more inputs being received by respective NFETs of the second array of NFETs.

3. The NOR decoder of claim 1, wherein the evaluation circuit includes an NFET stack, the NFET stack including a clocked evaluation NFET, a first evaluation NFET controlled by the first node, and a second evaluation NFET controlled by the third node.

4. The NOR decoder of claim 3 further comprising an array of PFETs connected in parallel between a voltage source and the second node, the array of PFETs including a first PFET controlled by the clock signal, a second PFET controlled by the first node, and a third PFET controlled by the third node.

5. The NOR decoder of claim 1 further comprising a third NOR decode circuit connected by a fourth node to the evaluation circuit, the third NOR decode circuit being configured to receive a third set of three or more inputs.

6. The NOR decoder of claim 5, wherein the evaluation circuit includes an NFET stack, the NFET stack including a clocked evaluation NFET, a first evaluation NFET controlled by the first node, a second evaluation NFET controlled by the third node, and a third evaluation NFET controlled by the fourth node.

7. The NOR decoder of claim 1 further comprising a reset input.

8. The NOR decoder of claim 1, wherein the NOR decoder utilizes a high active evaluation clock signal, wherein the high active evaluation clock signal is low during a pre-charge phase, and wherein the high active evaluation clock signal is high during an evaluation phase.

9. The NOR decoder of claim 1, wherein the NOR decoder operates without pre-decoding.

10. The NOR decoder of claim 1, wherein the second node is pulled from high to low in response to all inputs in the first set and the second set being low.

11. The NOR decoder of claim 1 further comprising an inverter coupled between the second node and an output node.

12. The NOR decoder of claim 1, wherein the NOR decoder is a complimentary NOR-NAND decoder.

13. An apparatus comprising:

a memory array; and a NOR decoder for accessing the memory array, the NOR decoder comprising:

a first NOR decode circuit connected by a first node to an evaluation circuit, the first NOR decode circuit being configured to receive a first set of three or more inputs, wherein the evaluation circuit is connected to a second node;

a second NOR decode circuit connected by a third node to the evaluation circuit, the second NOR decode circuit being configured to receive a second set of three or more inputs, wherein the evaluation circuit is configured to change a state of the second node in response to an active clock signal and all inputs in the first set and the second set having a same logical value; and a reset input.

14. The apparatus of claim 13, wherein the first NOR decode circuit includes:

a first stack of p-type field effect transistors (PFETs) connected in series between a voltage source and the first node, the first set of three or more inputs being received by respective PFETs in the first stack of PFETs; and a first array of n-type field effect transistors (NFETs) connected in parallel between a first clocked NFET and the first node, the first set of three or more inputs being received by respective NFETs of the first array of NFETs;

wherein the second NOR decode circuit includes:

a second stack of PFETs connected in series between the voltage source and the third node, the second set of three or more inputs being received by respective PFETs in the second stack of PFETs; and a second array of NFETs connected in parallel between a second clocked NFET and the third node, the second set of three or more inputs being received by respective NFETs of the second array of NFETs.

15. The apparatus of claim 13, wherein the evaluation circuit includes an NFET stack, the NFET stack including a clocked evaluation NFET, a first evaluation NFET controlled by the first node, and a second evaluation NFET controlled by the third node.

16. The apparatus of claim 15 further comprising an array of PFETs connected in parallel between a voltage source and the second node, the array of PFETs including a first PFET controlled by the clock signal, a second PFET controlled by the first node, and a third PFET controlled by the third node.

17. The apparatus of claim 13 further comprising a third NOR decode circuit connected by a fourth node to the evaluation circuit, the third NOR decode circuit being configured to receive a third set of three or more inputs.

18. The apparatus of claim 17, wherein the evaluation circuit includes an NFET stack, the NFET stack including a clocked evaluation NFET, a first evaluation NFET controlled by the first node, a second evaluation NFET controlled by the third node, and a third evaluation NFET controlled by the fourth node.

19. A method comprising:

detecting a first set of three or more inputs at a first NOR decode circuit of a NOR decoder, the first NOR decode circuit connected by a first node to an evaluation circuit, wherein the evaluation circuit is connected to a second node, and wherein the NOR decoder operates without pre-decoding;

detecting a second set of three or more inputs at a second NOR decode circuit of the NOR decoder, the second NOR decode circuit connected by a third node to the evaluation circuit; and changing, by the evaluation circuit of the NOR decoder, a state of the second node in response to an active clock signal and all inputs in the first set and the second set having a same logical value.

20. The method of claim 19, wherein the first NOR decode circuit, the second NOR decode circuit, and the evaluation circuit compose a single stage.

* * * * *